(12) United States Patent
Dimpflmaier et al.

(10) Patent No.: US 8,175,556 B2
(45) Date of Patent: May 8, 2012

(54) METHODS FOR OPTIMIZING POWER AMPLIFIER SETTINGS FOR OPERATION AT DIFFERENT RADIO-FREQUENCY BANDS

(75) Inventors: Ronald William Dimpflmaier, Los Gatos, CA (US); William Jean Noellert, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 286 days.

(21) Appl. No.: 12/634,426

(22) Filed: Dec. 9, 2009

(65) Prior Publication Data

US 2011/0136462 A1 Jun. 9, 2011

(51) Int. Cl.
*H04B 1/04* (2006.01)
*H04B 1/16* (2006.01)

(52) U.S. Cl. ............. 455/127.1; 455/552.1; 455/343.1

(58) Field of Classification Search ............. 455/127.4, 455/552.1, 127.1, 127.3, 311, 341, 343.1
See application file for complete search history.

(56) References Cited

U.S. PATENT DOCUMENTS

| | | | |
|---|---|---|---|
| 6,188,877 B1 | 2/2001 | Boesch et al. | |
| 6,281,755 B1* | 8/2001 | Feld et al. | 330/302 |
| 6,845,231 B2 | 1/2005 | Frank | |
| 7,292,649 B2 | 11/2007 | Atkinson et al. | |
| 7,570,124 B2* | 8/2009 | Haralabidis et al. | 331/51 |
| 7,573,410 B1* | 8/2009 | Georgantas et al. | 341/139 |
| 7,869,782 B2* | 1/2011 | Plevridis et al. | 455/260 |
| 7,928,802 B2* | 4/2011 | Ohnishi et al. | 330/286 |
| 2003/0148759 A1 | 8/2003 | Leliveld | |
| 2006/0189286 A1* | 8/2006 | Kyu et al. | 455/144 |
| 2006/0293005 A1* | 12/2006 | Hara et al. | 455/127.4 |
| 2009/0116510 A1* | 5/2009 | Georgantas et al. | 370/467 |

* cited by examiner

*Primary Examiner* — Sonny Trinh

(74) *Attorney, Agent, or Firm* — Treyz Law Group; Jason Tsai

(57) ABSTRACT

Electronic devices such as cellular telephones may include wireless communications circuitry such as power amplifiers. Power amplifiers, transmission lines, and other circuit associated the power amplifiers may generate different amounts of heat depending on their operating frequency. High-heat-producing power amplifiers may be biased at lower bias voltages than low-heat-producing amplifiers to equalize temperatures and enhance performance. Performance may also be optimized by placing power amplifiers on a printed circuit board so that the high band amplifiers are placed in regions that can dissipate more heat, whereas low band amplifiers are placed in regions that dissipate less heat.

24 Claims, 10 Drawing Sheets

| FREQUENCY BAND (MHz) | DISTANCE FROM CENTER (CM) |
|---|---|
| 1900 | 0 |
| 1800 | 0.9 |
| 900 | 2.1 |
| 850 | 3.2 |

METHODS FOR OPTIMIZING POWER AMPLIFIER SETTINGS FOR OPERATION AT DIFFERENT RADIO-FREQUENCY BANDS

BACKGROUND

This invention relates to wireless communications, and more particularly, to electronic devices with wireless communications capabilities.

Electronic devices such as cellular telephones, portable computers, media players, and hybrid devices are often provided with wireless communications capabilities. For example, cellular telephones may use long-range wireless communications to communicate with wireless base stations. Cellular telephones and other devices with wireless capabilities may communicate with the base stations using cellular telephone bands at 850 MHz, 900 MHz, 1800 MHz, and 1900 MHz. Wireless electronic devices may also use short-range wireless communications links. For example, wireless electronic devices may communicate with an access point using the Wi-Fi® (IEEE 802.11) bands at 2.4 GHz and 5.0 GHz and the Bluetooth® band at 2.4 GHz. Wireless electronic devices may also operate at the 3G data communications band (commonly referred to as UMTS or Universal Mobile Telecommunications Systems band) at 2170 MHz.

Wireless electronic devices include wireless communications circuitry. The wireless communications circuitry includes circuitry such as power amplifiers, low noise amplifiers, antennas, and transceiver circuitry. Power amplifiers are used to amplify radio-frequency signals generated by the transceiver circuitry. The radio-frequency signals are amplified by the power amplifiers prior to signal transmission to ensure that the signals are transmitted with sufficient signal strength.

Each radio-frequency band (e.g., 850 MHz, 900 MHz, 1800 MHz, and 1900 MHz) is typically served by a respective power amplifier. Each of these power amplifiers generally has different performance specifications and therefore different heat-generation characteristics. For example, low-band amplifiers tend to generate less heat than high-band amplifiers when operated under similar conditions. Because operating settings and board placement can also impact thermal performance, proper optimization of a system with multiple radio-frequency power amplifiers can be challenging.

It would therefore be desirable to be able to provide wireless electronic devices with optimized power amplifier configurations.

SUMMARY

Electronic devices with wireless communications capabilities are provided. Wireless electronic devices such as cellular telephones may have storage and processing circuitry, transceiver circuitry, power amplifiers, adjustable power supply circuitry, and other circuitry. The power amplifiers may operate at different radio-frequency bands. For example, there may be separate power amplifiers that operate at different cellular bands at 850 MHz, 900 MHz, 1800 MHz, and 1900 MHz. If desired, the power amplifiers may be used to operate at any frequency band.

Each power amplifier may have a power supply terminal that receives a bias voltage from the adjustable power supply circuitry. Each power amplifier may be biased at a different analog voltage level depending on its frequency of operation. Power amplifiers operating at higher frequencies are inherently more inefficient and therefore dissipate more heat than power amplifiers that operate at lower frequencies. Power amplifiers operating at higher frequencies may also be required to supply larger output powers (and generate more heat) to overcome loss that are sometimes associated with duplexers and other components operating at higher frequencies. It may therefore be desirable to bias power amplifiers that operate at higher frequencies with a lower bias voltage to equalize for thermal dissipation.

Power amplifiers may be fabricated on a single integrated circuit chip or on multiple integrated circuit chips. Regardless of how the power amplifiers are packaged, they may be placed on a circuit board such as a printed circuit board. A circuit board may be divided into regions according to the ability of each region to dissipate heat. For example, regions that exhibit high thermal dissipation characteristics may be categorized as high-heat-dissipating regions while regions that exhibit low thermal dissipation characteristics may be categorized as low-heat-dissipating regions. In general, regions that are closer to the center of a circuit board are able to dissipate more heat than regions that are located near the borders of the circuit board due to availability of additional heat sinking structures near the center of the board.

It may therefore be desirable to place power amplifiers that operate at higher cellular bands (e.g., at 1800 MHz and 1900 MHz) in high-heat-dissipating regions or medium/high-heat-dissipating regions (as an example). Similarly, it may be desirable to place power amplifiers that operate at lower cellular bands (e.g., at 850 MHz and 900 MHz) in low-heat-dissipating regions or low/medium-heat-dissipating regions. This type of placement scheme ensures that the power amplifiers that produce the most heat are located in the portions of a board that are best able to dissipate the heat. Further optimization may be obtained by adjusting the bias voltages for the power amplifiers so that higher band amplifiers are operated with lower biases and therefore produce less heat.

Any suitable combination of these techniques may be used to help optimize wireless performance. Consider a scenario in which there are first and second power amplifiers. The first power amplifier is operating at a higher radio-frequency band relative to the second power amplifier (e.g., the first power amplifier dissipates more heat). First, it may be possible to bias the first power amplifier at a low bias voltage and to place the first power amplifier in a high-heat-dissipating region while biasing the second power amplifier at a high bias voltage and placing the second power amplifier in a low-heat-dissipating region. Second, it may also be possible to place the first and second power amplifiers adjacent to one another in the same region but to bias the first power amplifier with a lower bias voltage. Third, it may also be possible to bias the first and second power amplifiers at the same bias voltage but to place the first power amplifier in a region that exhibits more thermal dissipation. Fourth, it may also be possible to bias the first power amplifier at a lower bias voltage but to place the first power amplifier in a region that can dissipate less heat, as long as the positive effect of the lower bias voltage is greater than the negative effect of the undesired board placement. Fifth, it may also be possible to place the first power amplifier in a region that can dissipate more heat but to bias the first power amplifier at a higher voltage, as long as the positive effect provided by the board placement overcompensates for the negative impact of the undesired bias voltage setting.

These techniques may be used to provide thermal equalization for any number of power amplifiers that are operating at different radio-frequencies or are dissipating different amounts of heat.

It may be desirable to characterize the various power amplifiers that operate at different frequencies. Each power amplifier may be characterized as a function of applied bias voltage, for example. Each region on a circuit board or area with a device may also be characterized for its thermal dissipation capabilities. Optimum power amplifier placement and bias settings may be determined and used based on the characterized results. A cellular telephone operating using these optimum placement and bias settings may exhibit enhanced power efficiency and reliability.

Further features of the present invention, its nature and various advantages will be more apparent from the accompanying drawings and the following detailed description.

DETAILED DESCRIPTION

This relates to electronic devices, and more particularly, to electronic devices with wireless communications capabilities. Wireless electronic devices such as cellular telephones, portable computers, media players, and hybrid devices may include wireless communications circuitry that provides the wireless communications capabilities.

Figure 1:
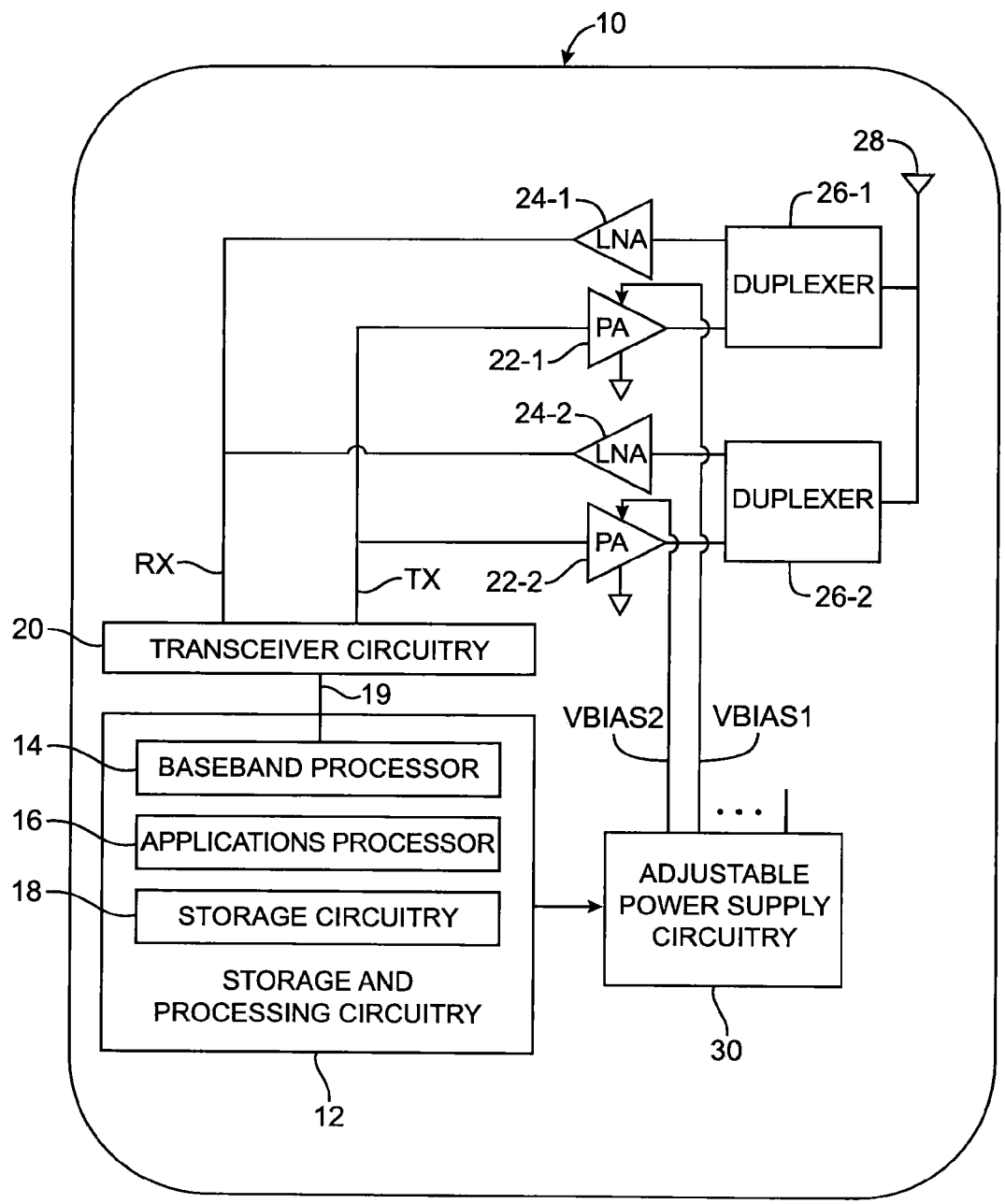
FIG. 1 is a schematic diagram showing circuitry located within a wireless electronic device such as a cellular telephone in accordance with an embodiment of the present invention.

A cellular telephone or other electronic device such as user device 10 of FIG. 1 may include wireless communications circuitry. User device 10 may be a mobile telephone, computing equipment such as a handheld electronic device, tablet computer, laptop computer, or other wireless device that communicates with a wireless network.

Device 10 may include storage and processing circuitry such as storage and processing circuitry 12. Storage and processing circuitry 12 may include a baseband processor such as baseband processor 14, an applications processor such as applications processor 16, and storage circuitry such as storage circuitry 18. Additional processors such as digital signal processing chips, application-specific integrated circuits, and other processing components may be included in circuitry 12. Applications processor 16 and baseband processor 14 may be used to perform digital signal processing operations for device 10. For example, applications processor 16 may be used to execute software for implementing a web browser, email application, or other applications. Storage circuitry 18 may include volatile and nonvolatile memory, hard drives, and other storage media and may be used in storing data for the processing components in circuitry 12.

Baseband processor 14 may be connected to transceiver circuitry such as transceiver circuitry 20 through data path 19. Baseband processor 14 may send and receive digital signals to and from transceiver 20 through data path 19. Baseband processor 14 may control the rate at which transceiver circuitry 20 is processing data and may control other transceiver settings.

Transceiver circuitry 20 may have input and output ports. The input port of transceiver circuitry 20 may be connected to a receive bus RX while the output port of transceiver circuitry 20 may be connected to a transmit bus TX. The TX and RX buses may each include at least one signal path that contains data to be transmitted or received.

For example, transmit bus TX may branch off to provide two transmit paths (e.g., first and second transmit paths). The transmit paths may be connected to input terminals of power amplifiers (PA) such as power amplifiers 22-1 and 22-2. More specifically, the first and second transmit paths may be connected to the input terminals of power amplifiers 22-1 and 22-2, respectively. The Power amplifiers may be used to amplify radio-frequency signals provided by transceiver circuitry 20 prior to transmitting the signals through antenna 28. The example of FIG. 1 showing the use of two power amplifiers is merely illustrative. If desired, transmit bus TX may branch off to provide any number of power amplifiers with radio-frequency signals for transmission.

Similarly, receive bus RX may branch off to multiple receive paths such as first and second receive paths. As shown in FIG. 1, the first and second receive paths may be connected to respective output terminals of low-noise amplifiers (LNA) 24-1 and 24-2. The low-noise amplifiers may be used to amplify received radio-frequency signals while generating low noise content. This example showing the use of two low-noise amplifiers is merely illustrative. If desired, receive bus RX may branch off to connect to any number of LNA outputs.

Power amplifier 22-1 may have an output terminal connected to a duplexer such as duplexer 26-1. A duplexer is a device that routes signals based on frequency and that may therefore allows for bidirectional communications (e.g., transmitting and receiving wireless signals). The duplexer isolates the transmit operation from the receive operation to allow the system to share a common antenna.

Low-noise amplifier 24-1 may have an input terminal connected to duplexer 26-1. Duplexer 26-1 may have an antenna port connected to an antenna such as antenna 28. Antenna 28 may be used to broadcast and receive analog radio-frequency signals. There may be other circuitry such as matching circuits and filters coupled between duplexer 26-1 and the antenna.

Power amplifier 22-2 may have an output terminal connected to another duplexer such as duplexer 26-2. Low-noise amplifier 24-2 may have an input terminal connected to duplexer 26-2. Duplexer 26-2 may also have an antenna port connected to antenna 28. Antenna 28 may be shared among multiple duplexers. If desired, each duplexer may be connected to a separate antenna.

Antenna 28 and associated wireless communications circuitry (e.g., duplexers 26, power amplifiers 22, low-noise amplifiers 24, etc.) of device 10 may support wireless communications over any suitable radio-frequency communications band. For example, device 10 may be used to cover communications frequency bands such as cellular telephone voice and data bands at 850 MHz, 900 MHz, 1800 MHz, and 1900 MHz. In this example, power amplifier 22-1 and associated circuitry (e.g., LNA 24-1 and duplexer 26-1) may be used to cover wireless data transmission at 850 MHz, whereas power amplifier 22-2 and associated circuitry (e.g., LNA 24-2 and duplexer 26-2) may be used to provide wireless data transmission at 900 MHz. Each power amplifier may be used to transmit at different radio-frequency bands. Two additional power amplifiers and associated circuitry may be used to cover the cellular frequency bands at 1800 MHz and 1900 MHz.

If desired, the wireless communications circuitry shown in FIG. 1 may be used to cover the communications band at 2170 MHz band (commonly referred to as a UMTS or Universal Mobile Telecommunications System band), the Wi-Fi (IEEE 802.11) bands at 2.4 GHz and 5.0 GHz (also sometimes referred to as wireless local area network or WLAN bands), the Bluetooth band at 2.4 GHz, and other bands.

Storage and processing circuitry 12 may be connected to a power supply such as adjustable power supply circuitry 30. Storage and processing circuitry 12 may control power supply circuitry 30 to produce any number of desired output voltages. For example, power supply circuitry 30 may generate bias voltages such as bias voltages VBIAS1 and VBIAS2. Power amplifiers 22-1 and 22-2 may each have a power supply terminal that is driven to a respective bias voltage. For example, the power supply terminal of power amplifier 22-1 may be supplied with a bias voltage VBIAS1 while the power supply terminal of power amplifier 22-2 may be supplied with a bias voltage VBIAS2. Bias voltages VBIAS1 and VBIAS2 may have different values. The different bias voltages may be provided on separate power supply lines, as shown in FIG. 1.

Figure 2:
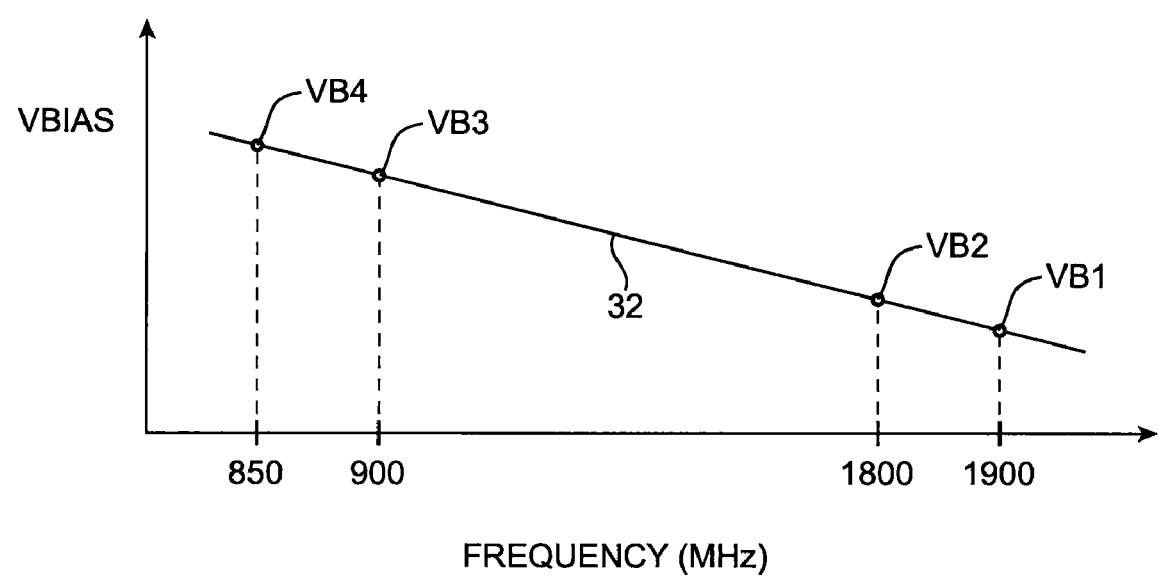
FIG. 2 is a graph illustrating how bias voltages of power amplifiers may be varied as a function of operating radio-frequency band to help equalize heat production between amplifiers in accordance with an embodiment of the present invention.

Different power amplifiers that are used to transmit signals at different radio-frequency bands may be biased at different bias voltage levels, as shown in FIG. 2. Power amplifiers that operate at higher frequency bands may be inherently more inefficient and may therefore generate more heat than power amplifiers that operate at lower frequency bands for a given set of input and bias conditions. One way to equalize or compensate for this imbalance in thermal heat production is to bias power amplifiers that are operating at higher frequency bands at lower voltage levels.

For example, consider a scenario in which a first power amplifier is operating at 1900 MHz, a second power amplifier is operating at 1800 MHz, a third power amplifier is operating at 900 MHz, and a fourth power amplifier is operating at 850 MHz. The first, second, third, and fourth power amplifiers may be biased at bias voltages VB1, VB2, VB3, and VB4 respectively. Voltages VB1-4 may be analog voltage signals that can be independently tuned by controlling power supply circuitry 30. Bias voltages VB1-4 may have increasing voltage values. For example, voltage VB1 may have a voltage value that is less than the voltage value of VB2, voltage VB2 may have a voltage value that is less than the voltage value of VB3, and so on. Line 32 of FIG. 2 shows the general trend of the bias voltage values as a function of operating frequency. Decreasing bias voltages as frequency increases (e.g., a negative slope in curve 32) may be beneficial in equalizing the higher heat production characteristic of power amplifiers operating at higher cellular frequency bands. Equalizing heat production in this way may help balance performance between low and high band amplifiers, thereby enhancing overall performance.

Figure 3:
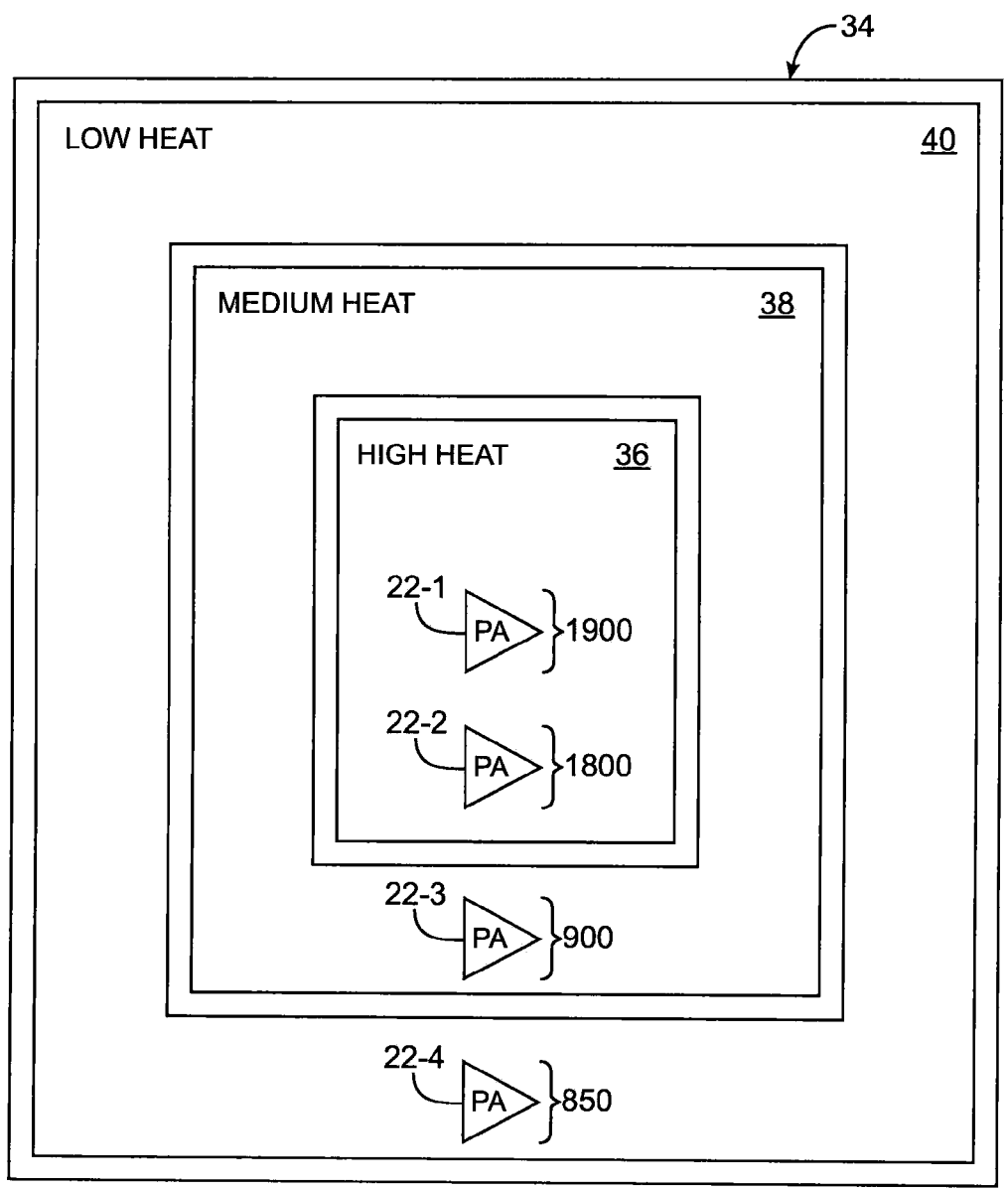
FIG. 3 is a diagram showing how a circuit board may be organized into different thermal dissipation regions in accordance with an embodiment of the present invention.

As shown in FIG. 3, the wireless communications circuitry in device 10 may be manufactured on a substrate such as printed circuit board 34 (i.e., a rigid printed circuit board or a flex circuit). As shown in FIG. 3, circuit board 34 may be divided into regions that are categorized by their capability to dissipate or absorb heat. For example, circuit board 34 may have a central region such as region 36 that exhibits high heat dissipation rates. Immediately surrounding region 36 may be an intermediate region such as region 38 that exhibits medium rates of heat dissipation. Likewise, immediately surrounding region 38 may be an outer region such as region 40 that exhibits low rates of heat dissipation. Region 36 may be referred to as a high-heat-dissipating region while region 40 may be referred to as a low-heat-dissipating region herein.

Regions such as region 36 that are located at the center of circuit board 34 and that are far away from the edges of circuit board 34 may be able to dissipate more heat than surrounding regions (e.g., regions 38 and 40). Regions such as region 40 that are located at the borders of circuit board 34 and that are adjacent to the edges of the circuit board may not be as effective in dissipating heat generated by electronic components. As a result, it may be desirable to place power amplifiers that generate more heat closer to the center of circuit board 34 (e.g., in region 36). Power amplifiers that dissipate less heat may be placed at the edges (e.g., in region 40) of circuit board 34.

For example, it may be desirable to place power amplifiers 22-1 and 22-1 that operate at respective cellular bands of 1900 MHz and 1800 MHz in region 38. Similarly, it may be desirable to place power amplifiers 22-3 and 22-4 that operate at cellular bands of 900 MHZ and 800 MHz in regions 38 and 40 respectively, as shown in FIG. 3.

Figures 4, 5:
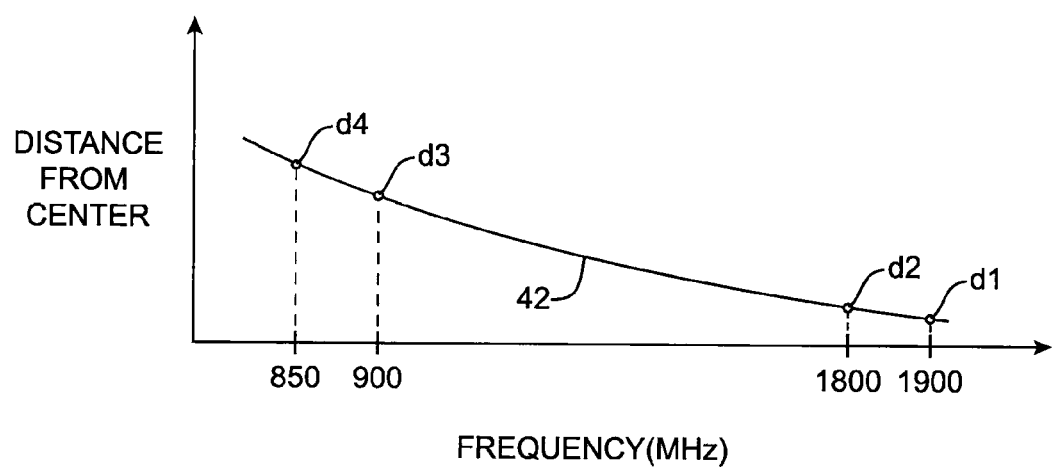
FIG. 4 is a table showing how different power amplifiers operating at different radio-frequency bands may be placed on a circuit board in accordance with an embodiment of the present invention.
FIG. 5 is a graph illustrating how different power amplifiers operating at different radio-frequency bands may be placed at varying distances from a center of a circuit board in accordance with an embodiment of the present invention.

One illustrative placement of the power amplifiers is shown in the table of FIG. 4. Circuit board 34 may have a center. Each power amplifier 22 may be placed at a certain distance (e.g., a certain distance) away from the center on circuit board 34. For example, power amplifier 22-1 operating at 1900 MHz may be placed directly at the center (e.g., zero cm from the center). Power amplifier 22-2 operating at 1800 MHz may be placed 0.9 cm from the center (e.g., at the edge of region 38). Power amplifier 22-3 operating at 900 MHz may be placed 2.1 cm from the center (e.g., within in region 38). Power amplifier 22-4 operating at 850 MHz may be placed 3.2 cm from the center (e.g., within in region 40).

The configuration of FIG. 4 can be plotted as a graph, as shown in FIG. 5. In general, power amplifiers that are operating at higher radio-frequency bands should be placed closer to the center of the circuit board (i.e., smaller distance from the center). As an example, power amplifiers operating at 1900 MHz, 1800 MHz, 900 MHz and 850 MHz may be placed at distances d1, d2, d3, and d4 from the center of circuit board 34. Distance d1 may be less than d2, distance d2 may be less than d3, and so on. Curve 42 of FIG. 5 shows the general desired trend of placing higher heat-generating components closer to the center of circuit board 34 with this approach.

Figure 6:
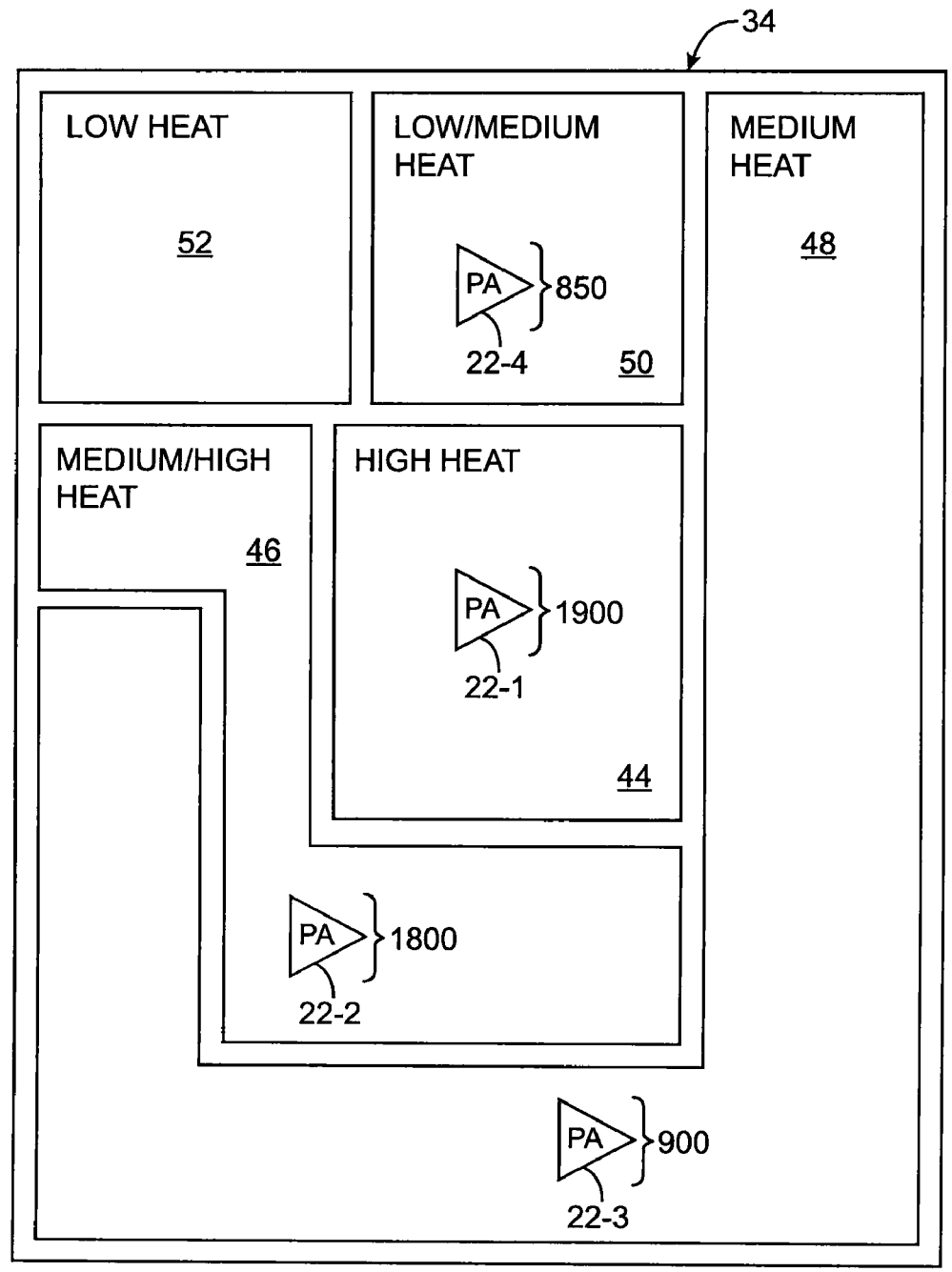
FIG. 6 is a diagram showing how a circuit board may be characterized by regions that dissipate heat at different rates and showing how power amplifiers may be located in these regions in accordance with an embodiment of the present invention.

The regions of the type described in connection with FIG. 3 may not necessarily be organized in a regular pattern. As shown in FIG. 6, circuit board 34 may be characterized by thermal dissipation regions with a variety of shapes and areas. For example, a high-heat-dissipating region such as region 44 may be located at the center of circuit board 34. Immediately adjacent to region 44 may be a medium/high-heat-dissipating region such as region 46, a medium-heat-dissipating region such as region 48, and a low/medium-heat-dissipating region such as region 50. The remaining area on board 34 may be assigned as a low-heat-dissipating region such as region 52. Regions 46 and 48 may be irregularly shaped with multiple bends.

Regions 44, 46, 48, 50, and 52 are listed in descending order of heat dissipating capability. Different power amplifiers with different thermal generation profiles (e.g., that generate different amounts of heat) may be placed accordingly into regions that adhere to the order of heat dissipating capability. For example, power amplifier 22-1 operating at 1900 MHz may be placed in region 44. Power amplifier 22-2 operating at 1800 MHz may be placed in any region of equal or lower heat-dissipating capability in comparison to region 44. Power amplifier 22-2 may thus be placed in region 46, as shown in FIG. 6. If desired, power amplifier 22-2 may be placed in region 44.

Assuming power amplifier 22-2 is placed in region 46, power amplifier 22-3 operating at 900 MHz may be place in any region that has an equal or lower heat-dissipating capability in comparison to region 46. Power amplifier 22-3 may be place in region 48, as an example. Similarly, power amplifier 22-4 operating at 850 MHz may be placed in any region that has equal or less heat-dissipating capability in comparison to region 48. Power amplifier 22-4 may be placed in region 50 (as an example). If desired, power amplifier 22-4 may be placed in region 48 or 52, because regions 48, 50, and 52 have an equal or lower heat-dissipating capability than the region containing power amplifier 22-3 (i.e., region 48).

Figure 7:
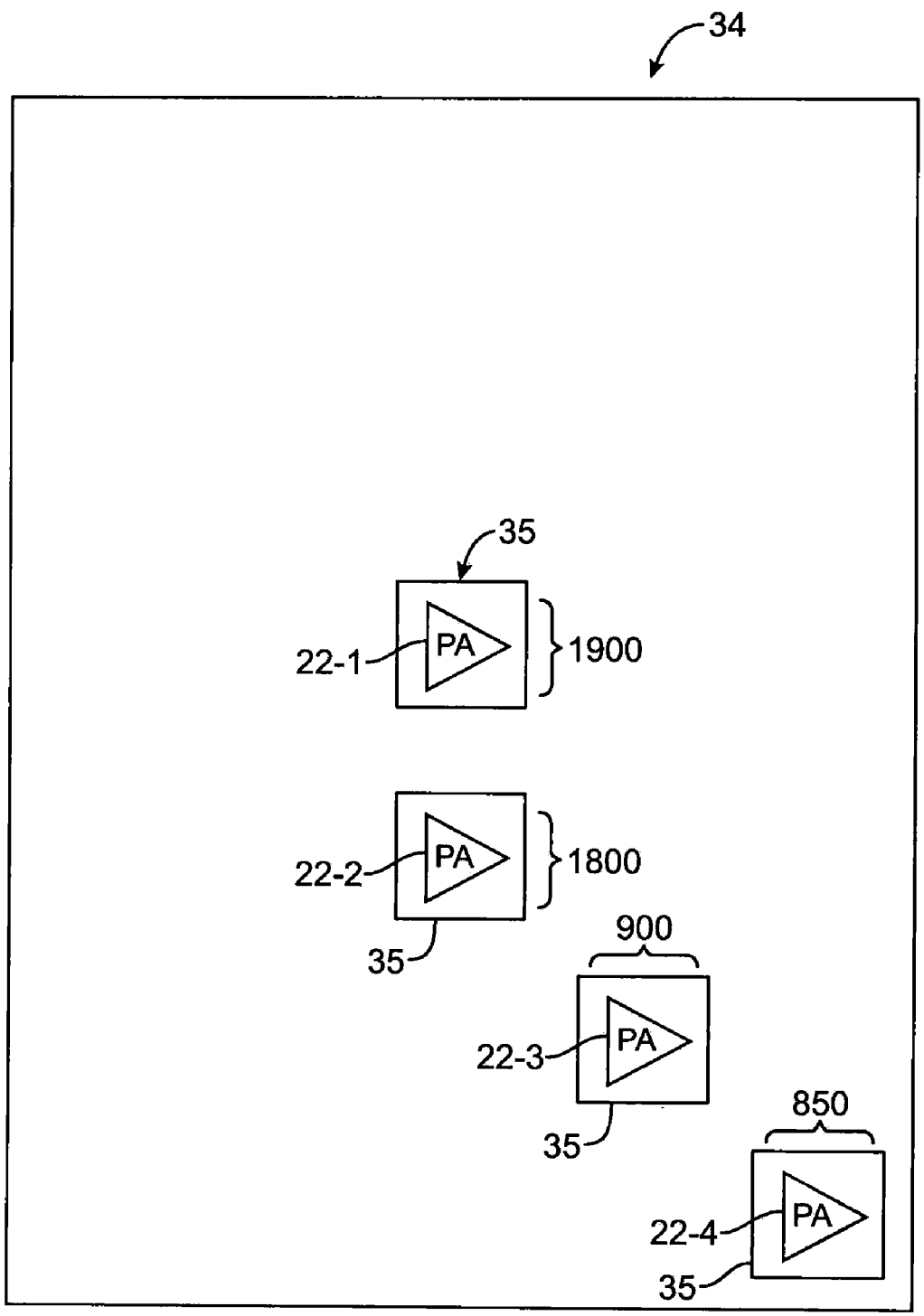
FIG. 7 is a diagram showing how each power amplifier may be fabricated on a respective integrated circuit chip and how each integrated circuit chip may be placed at an optimized location on a circuit board in accordance with an embodiment of the present invention.

As shown in FIG. 7, each power amplifier 22 may be fabricated on a separate piece of silicon and may be packaged into separate integrated circuit chips such as integrated circuit chips 35. Each integrated circuit chip 35 may be placed on circuit board 34 in a region that can satisfactorily dissipate that heat generated by that chip. Integrated circuit chips may lie in a straight line or be placed in other suitable arrangements.

Figure 8:
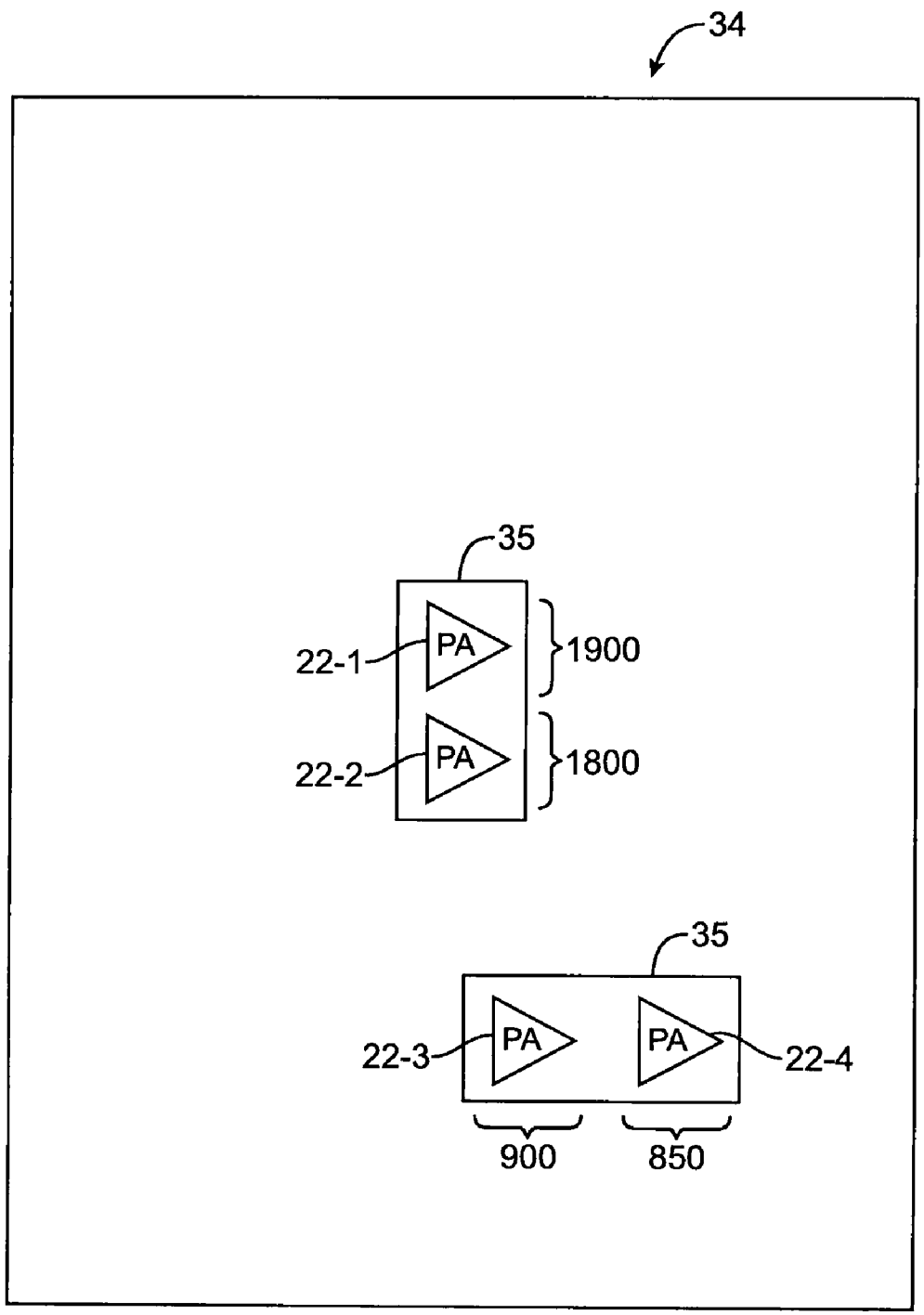
FIG. 8 is a diagram show how multiple power amplifiers may be fabricated on integrated circuits and how integrated circuits may be placed at various locations on a circuit board in accordance with an embodiment of the present invention.

If desired, multiple power amplifiers may be fabricated on a single integrated circuit chip. For example, two power amplifiers may be fabricated on each integrated circuit chip 35, as shown in FIG. 8. It may be desirably to group power amplifiers according to the cellular band at which they operate. For example, it may be desirable for the power amplifiers that operate at higher cellular bands (e.g., power amplifiers 22-1 and 22-2 operating at 1900 MHz and 1800 MHz, respectively) to be implemented using a first integrated circuit chip. Similarly, it may be desirable for the power amplifiers that operate at lower cellular bands (e.g., power amplifiers 22-3 and 22-4 operating at 900 MHz and 850 MHz, respectively) to be implemented using a second integrated circuit chip. These integrated circuit chips may be placed in an orientation on circuit board 34 in which power amplifiers that generate more heat are located closer to the center of the circuit board (see, e.g., FIG. 8).

Figure 9:
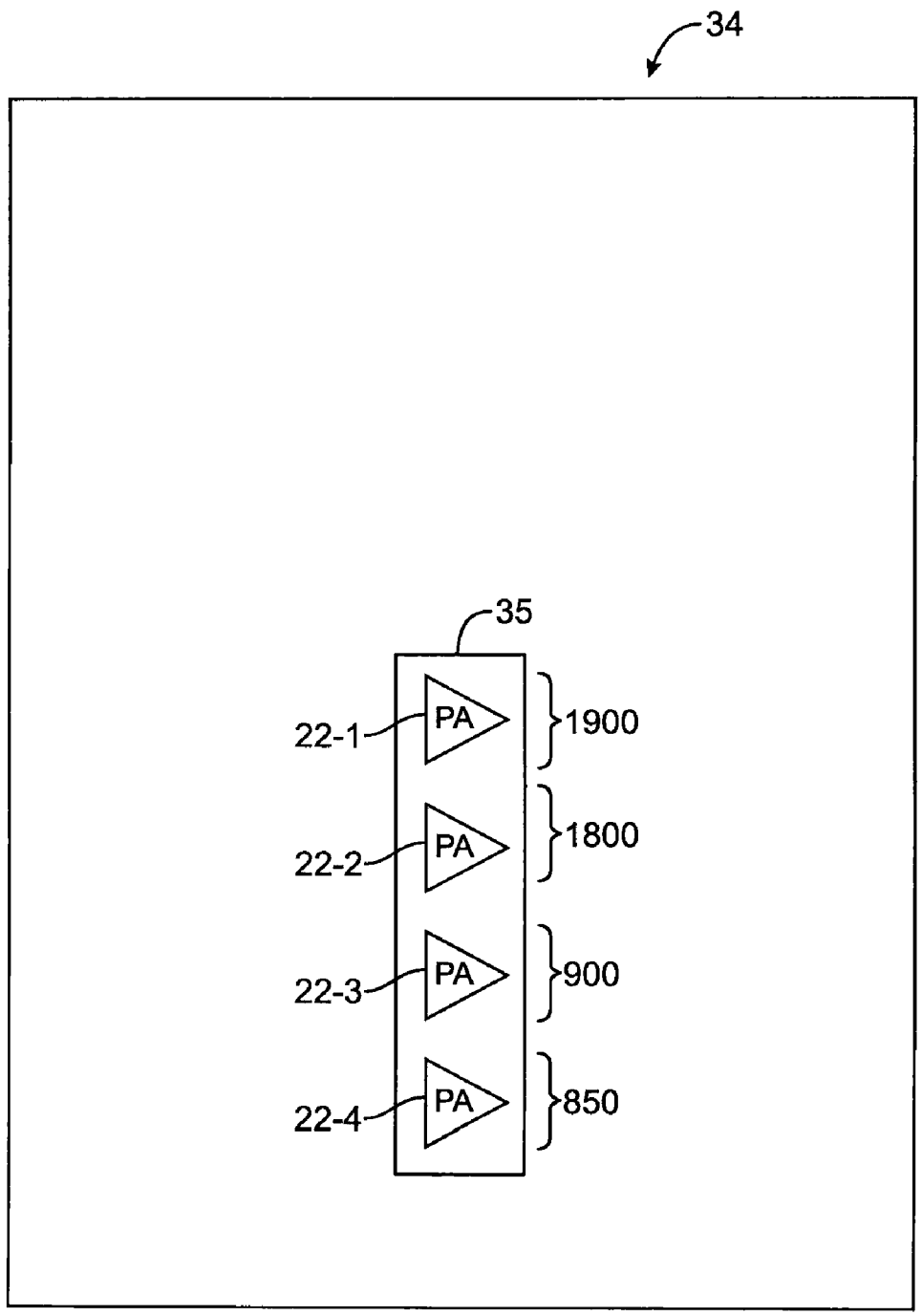
FIG. 9 is a diagram show how multiple power amplifiers may be fabricated on a single integrated circuit chip and how the integrated circuit chip may be placed in a desired orientation on a circuit board in accordance with an embodiment of the present invention.

If desired, all four power amplifiers may be placed on a single integrated circuit chip, as shown in FIG. 9. As discussed previously, it may be desirable to orient integrated circuit chip 35 on circuit board 34 so that power amplifiers that generate less heat are located closer the edges of the circuit board.

The examples described in connection with FIGS. 7, 8, and 9 are merely illustrative. If desired, two power amplifiers may be formed on one integrated circuit chip while the remaining two power amplifiers are individually formed on two separate integrated circuit chips. Three power amplifiers may be formed on one integrated circuit chip while the remaining power amplifier is individually formed on another integrated circuit chip. It may not always be possible to place the highest heat-generating power amplifier closest to the center of circuit board 34, because there may be other design concerns and issues that take priority over thermal dissipation concerns. Nevertheless, placement of at least some of the power amplifiers on a board according to these principals may help improve thermal dissipation and device performance.

The relative efficiencies of the radio-frequency power amplifiers may generally be dependent on their operating frequencies. The operating frequency of duplexers (e.g., duplex filters), however, may also have an effect on the requirements of the power amplifiers. Duplexers operating in one frequency band may be more lossy than duplexers operating in another frequency band. This difference may impose requirements that impact the amount of heat generated by the power amplifiers.

For example, consider a scenario in which a first radio-frequency power amplifier is designed to operated in UMTS frequency band 5 with a transmit frequency range of 824 MHz to 849 MHz. The first power amplifier may have a corresponding first duplex filter. The first duplex filter may have a nominal loss of 2.0 dB in a transmit mode. The desired maximum output power at the antenna may be +24 dBm (as an example). Thus, to achieve the output power of +24 dBm, the first power amplifier must deliver at least +26 dBm (24 dBm increased by 2 dB) to overcome the nominal loss of the first duplex filter.

Consider another scenario in which a second power amplifier is designed to operate in UMTS frequency band 8 with a transmit frequency range of 880 MHz to 915 MHz. The second power amplifier may have a corresponding second duplex filter. The second duplex filter may have a nominal loss of 3.0 dB in the transmit mode. Assuming the desired maximum output power of the antenna is the same (i.e., +24 dBm), the second power amplifier in this scenario must deliver at least +27 dBm to overcome the nominal loss of 3.0 dBm.

The first and second power amplifiers may have similar efficiencies, because they operate in very similar frequency ranges. The second power amplifier, however, may generate more heat, because the second power amplifier is required to deliver 1 dB more power than the first power amplifier to achieve the same antenna output power.

The difference in duplexer loss may depend on the filter requirements for these frequency bands. For example, in the scenario of UMTS frequency band 5, the receive frequency range is from 869 MHz to 894 MHz. The receive frequency range is 20 MHz away from the transmit frequency range. In the scenario of UMTS frequency band 8, the receive frequency range is from 925 MHz to 960 MHz. The receive frequency in this case is only 10 MHz away from the transmit frequency range. The duplex filter used for band 8 may therefore require a relatively steeper rejection to prevent high levels of transmit noise from leaking into the receiver and degrading reception. A steeper attenuation may require more poles in the implementation of the filter. More poles may increase nominal loss in the pass-band of the duplex filter. To summarize, these inherent differences in duplexer loss characteristics may impact power amplifier heat generation and thus affect voltage bias and the board placement of the power amplifiers.

Figure 10:
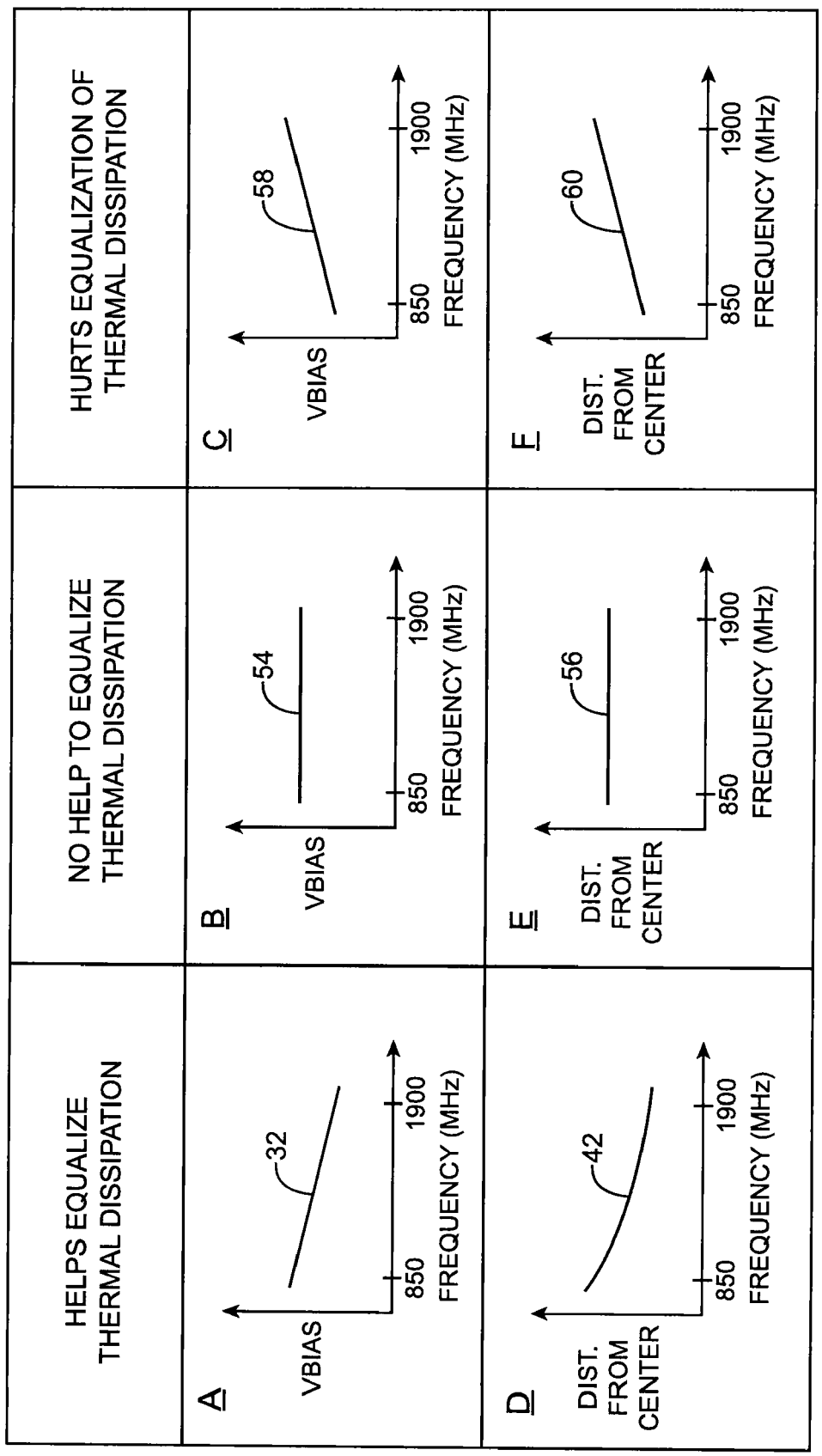
FIG. 10 is a table showing various techniques that can be used to optimize power amplifier performance in accordance with an embodiment of the present invention.

FIG. 10 summarizes various techniques that may be implemented on the power amplifiers on a circuit board. As described in connection with FIG. 2, technique A involves lowering the bias voltage of power amplifiers 22 as operating frequency increases (e.g., the slope of curve 32 is negative). Lowering the bias voltage may help equalize (compensate) the heat generated, by lowering the amount of heat generated by the high band amplifiers relative to the hat generated by the low band amplifiers. A simpler technique such as technique B involves biasing power amplifiers 22 at a common voltage level (e.g., so that curve 54 has zero slope). Biasing power amplifiers in this way may have a neutral effect on equalization of thermal dissipation. On the other hand, technique C involves raising the bias voltage of power amplifiers 22 as operating frequency increases (e.g., the slope of curve 58 is positive). Increasing the bias voltage may have a negative impact on the equalization of heat generation.

For example, it may be possible that a first power amplifier operating at high frequencies is biased at a higher voltage in comparison to a second power amplifier operating at low frequencies, because of performance requirements. The first power amplifier may be operating less efficiently and may generate considerably more heat than the second power amplifier.

Apart from varying bias voltages, placing the power amplifiers in desired locations may also affect thermal dissipation. As described in connection with FIG. 5, technique D involves placing power amplifiers that generate more heat (e.g., power amplifiers operating at higher cellular bands) at a smaller distance from the center of circuit board 34 (e.g., the slope of curve 42 is negative). Placing the power amplifiers in this way may help equalize the thermal dissipation of high-heat-generating components. Alternatively, power amplifiers 22 may all be clustered in one location close to one another (e.g., curve 56 has zero slope). Placing the power amplifiers at the same distance from the center of circuit board 34 may have a neutral effect on thermal equalization. In contrast to techniques D and E, technique F involves placing powers amplifiers that generate more heat (e.g., power amplifiers operating at higher cellular bands) at a greater distance from the center of circuit board 34 (e.g., the slope of curve 60 is positive). Placing the power amplifiers in this way may work against equalization of power amplifier temperatures.

For example, it may be possible that a first power amplifier operating at a high frequency band is placed near the edges of circuit board 34, whereas a second power amplifier operating at a low frequency band is placed near the center of circuit board 34, because of wire routing concerns. The first power amplifier may therefore be operating under elevated stress.

There are at least two ways in which equalization of heat generation can be independently achieved. For example, it is possible to combine techniques A and D to equalize the temperatures produced by different power amplifiers on circuit board 34. Combining techniques A and D may be most effective, because both techniques help thermal equalization.

Another possible combination involves using techniques A and E. Because the effect of technique E on thermal equalization is neutral, the overall effect of the combination is still positive and can help equalize temperatures. Similarly, techniques B and D may be combined to produce an overall positive effect since technique D helps thermal equalization while technique B is neutral.

Another possible combination involves using techniques A and F. This combination may be acceptable as long as the positive effect provided by technique A more than compensates for the negative effect of technique F. In the same way, combining techniques C and D may be acceptable, provided that the negative effect of technique C is more than compensated for by the positive impact provided by technique D. The combinations mentioned herein are merely illustrative. Any other combination may be used to provide a desired degree of thermal equalization, if desired.

In general, it may be desirable to operate the radio-frequency power amplifiers with the lowest possible bias voltage to achieve optimum efficiency. The lowest possible bias voltage is limited by the linearity of the power amplifiers. Sufficient linearity of the power amplifiers must be maintained to ensure that desired performance criteria are satisfied (e.g., low noise). The linearity of the power amplifiers may be dependent on the operating temperature. Linearity may be improved at lower operating temperatures. It may therefore be desired to arrange power amplifiers on a board from a thermal point of view. For example, a power amplifier may produce a considerable amount of heat. The power amplifier may therefore be placed in a region that can rapidly dissipate a high amount of heat. Because the heat generated by the power amplifier may be effectively dissipated due to good board placement, the operating temperature of the power amplifier may be kept at a moderate level, thereby improving the linearity of the power amplifier. Configuring the power amplifier in this way may allow a designer to bias the power amplifier at the lowest possible bias voltage for a specific placement. The different power amplifiers on a circuit board may be optimized using this approach.

Figure 11:
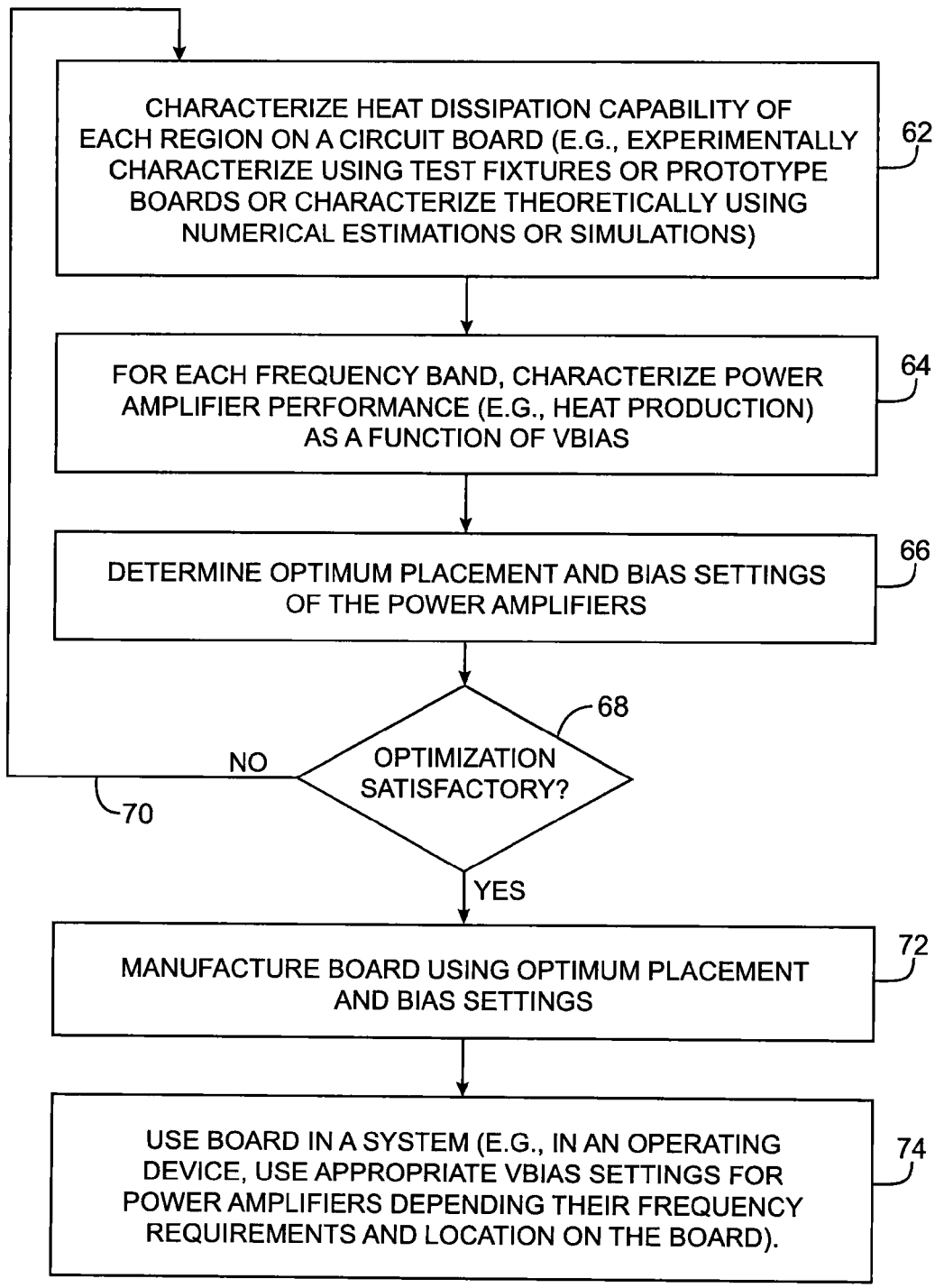
FIG. 11 is a flow chart of illustrative steps involved in determining an optimum power amplifier configuration for power amplifiers that are operating at different radio-frequency bands on a circuit board in accordance with an embodiment of the present invention.

FIG. 11 shows illustrative steps involved in configuring a device with multiple power amplifiers to equalize temperatures and thereby enhance performance. Because it may be desirable to optimize the power amplifiers from a thermal point of view, it may be desirable to first characterize the heat dissipation capability of each region on circuit board 34 (step 62). For example, it may be desirable to experimentally characterize the thermal dissipation for the various regions by performing tests on test fixtures or prototype boards. If desired, such characterizations may also be performed using numerical estimations or software simulations.

Once the board regions have been characterized for their ability to dissipate heat, it may be desirable to characterize the different power amplifiers to measure their dependence on bias voltage VBIAS (step 64). In general, higher bias voltages translate to higher transmit power for the power amplifiers and elevated levels of heat generation. The power amplifier for each cellular band may produce different amounts of heat as a function of VBIAS.

At step 66, test and design equipment may be used to determine optimum placement and bias settings for power amplifiers 22. The optimum placement and bias settings may be based on the characterization results obtained during steps 62 and 64. The optimum bias settings may reflect the lowest possible bias voltages for a particular board placement. The optimum placement and bias settings obtained during step 66 may reflect results from only one optimization iteration. Because there may be an intractable number of solutions to this optimization problem, each optimization iteration may involve several simplifying assumptions. The simplifying assumptions made during each iteration may not always be completely valid, but nevertheless may help a designer advance to an acceptable design.

There may be a minimum specification requirement indicating a minimum acceptable thermal characteristic. If the optimum placement and bias settings obtained during step 66 does not satisfy the minimum acceptable thermal requirement (e.g., maximum allowable temperature), processing may loop back to step 62 as indicated by path 70. If the optimum placement and bias settings obtained during step 66 satisfies the minimum acceptable thermal requirement, processing may proceed to step 72.

At step 72, a circuit board may be manufactured based on the satisfactory optimum placement and bias settings. All necessary circuit required for operation of device 10 may be mounted on the circuit board during step 72.

At step 74, the circuit board manufactured during step 72 may be used in a system such as a cellular telephone. The cellular telephone may contain power amplifiers formed on the circuit board. The power amplifiers may be placed in an optimized configuration on the circuit board. The power amplifiers may be biased at respective optimum voltage settings depending on the cellular band in which they are operating.

If desired, thermal characterization operations may be applied to circuitry other than power amplifiers such as power supply components or other electronic components that generate considerable amount of heat on a circuit board.

The foregoing is merely illustrative of the principles of this invention and various modifications can be made by those skilled in the art without departing from the scope and spirit of the invention.

What is claimed is:

1. Cellular telephone circuitry, comprising:
  a first radio-frequency power amplifier operating at a first radio-frequency communications band, wherein the first radio-frequency power amplifier has a first power supply terminal and wherein the first power supply terminal receives a first bias voltage; and
  a second radio-frequency power amplifier operating at a second radio-frequency communications band, wherein the second radio-frequency power amplifier has a second power supply terminal, wherein the second power supply terminal receives a second bias voltage, wherein the first radio-frequency communications band is higher in frequency than the second radio-frequency communications band, and wherein the second bias voltage is greater than the first bias voltage.

2. The cellular telephone circuitry defined in claim 1, further comprising:
  a third radio-frequency power amplifier operating at a third radio-frequency communications band, wherein the third radio-frequency power amplifier has a third power supply terminal, wherein the third power supply terminal receives a third bias voltage, wherein the second radio-frequency communications band is higher in frequency than the third radio-frequency communications band, and wherein the third bias voltage is greater than the second bias voltage.

3. The cellular telephone circuitry defined in claim 2, further comprising:
  a fourth radio-frequency power amplifier operating at a fourth radio-frequency communications band, wherein the fourth radio-frequency power amplifier has a fourth power supply terminal, wherein the fourth power supply terminal receives a fourth bias voltage, wherein the third radio-frequency communications band is higher in frequency than the fourth radio-frequency communications band, and wherein the fourth bias voltage is greater than the third bias voltage.

4. The cellular telephone circuitry defined in claim 3, further comprising:
  storage and processing circuitry; and
  adjustable power supply circuitry coupled to the storage and processing circuitry, wherein the adjustable power supply circuitry provides the first, second, third, and fourth bias voltages.

5. The cellular telephone circuitry defined in claim 4, further comprising:
  a printed circuit board having a center, wherein the first, second, third, and fourth radio-frequency power amplifiers are mounted on the printed circuit board, wherein the first radio-frequency power amplifier is located at a first distance from the center, wherein the second radio-frequency power amplifier is located at a second distance from the center, wherein the third radio-frequency power amplifier is located at a third distance from the center, wherein the fourth radio-frequency power amplifier is located at a fourth distance from the center, and wherein the fourth distance is greater than the first distance.

6. The cellular telephone circuitry defined in claim 5, wherein the second distance is greater than the first distance, wherein the third distance is greater than the second distance, and wherein the fourth distance is greater than the third distance.

7. The cellular telephone circuitry defined in claim 5, wherein the second and third distances have substantially equal lengths.

8. The cellular telephone circuitry defined in claim 5, wherein the first distance is greater than the second distance, wherein the second distance is greater than the third distance, and wherein the third distance is greater than the fourth distance.

9. The cellular telephone circuitry defined in claim 3, wherein the first radio-frequency communications band comprises a 1900 MHz band, wherein the second radio-frequency communications band comprises a 1800 MHz band, wherein the third radio-frequency communications band comprises a 900 MHz band, and wherein the fourth radio-frequency communications band comprises a 850 MHz band.

10. The cellular telephone circuitry defined in claim 9, wherein the first radio-frequency power amplifier is formed on a first integrated circuit, wherein the second radio-frequency power amplifier is formed on a second integrated circuit, wherein the third radio-frequency power amplifier is formed on a third integrated circuit, and wherein the fourth radio-frequency power amplifier is formed on a fourth integrated circuit.

11. The cellular telephone circuitry defined in claim 9, wherein at least two of the four radio-frequency power amplifiers are formed on a single integrated circuit.

12. The cellular telephone circuitry defined in claim 9, further comprising:
  a printed circuit board, wherein the first radio-frequency power amplifier is placed in a first region on the printed circuit board, wherein the second radio-frequency power amplifier is placed in a second region on the printed circuit board, wherein the third radio-frequency power amplifier is placed in a third region on the printed circuit board, wherein fourth radio-frequency power amplifier is placed in a fourth region on the printed circuit board, wherein the first region has dissipates heat more rapidly than the second region, wherein the second region dissipates heat more rapidly than the third region, and wherein the third region dissipates heat more rapidly than the fourth region.

13. A method of operating a cellular telephone having first, second, third, and fourth radio-frequency power amplifiers, wherein the first radio-frequency power amplifier operates at a first cellular frequency band, wherein the second radio-frequency power amplifier operates at a second cellular frequency band, wherein the third radio-frequency power amplifier operates at a third cellular frequency band, and wherein the fourth radio-frequency power amplifier operates at a fourth cellular frequency band, the method comprising:
  biasing the first radio-frequency power amplifier with a first bias voltage;
  biasing the second radio-frequency power amplifier with a second bias voltage;
  biasing the third radio-frequency power amplifier with a third bias voltage; and biasing the fourth radio-frequency power amplifier with a fourth bias voltage, wherein the first cellular frequency band is higher in frequency than the second cellular frequency band, wherein the second cellular frequency band is higher in frequency than the third cellular frequency band, wherein the third cellular frequency band is higher in frequency than the fourth cellular frequency band, and wherein the fourth bias voltage is greater than the first bias voltage.

14. The method defined in claim 13, further comprising:
biasing the third bias voltage to a voltage value higher than the second bias voltage.

15. The method defined in claim 13, further comprising:
biasing the fourth bias voltage to a voltage value that is higher than the third bias voltage; and
biasing the second bias voltage to another voltage value that is higher than the first bias voltage.

16. The method defined in claim 13, wherein the radio-frequency power amplifiers each have a power supply terminal, the method further comprising:
with adjustable power supply circuitry, providing the first, second, third, and fourth bias voltages that are supplied to the respective power supply terminals.

17. The method defined in claim 13, further comprising:
operating the first radio-frequency power amplifier at the first cellular frequency band, wherein the first cellular frequency band induces a 1900 MHz frequency;
operating the second radio-frequency power amplifier at the second cellular frequency band, wherein the second cellular frequency band induces a 1800 MHz frequency;
operating the third radio-frequency power amplifier at the third cellular frequency band, wherein the third cellular frequency band induces a 900 MHz frequency; and
operating the fourth radio-frequency power amplifier at the fourth cellular frequency band, wherein the fourth cellular frequency band induces a 850 MHz frequency.

18. The method defined in claim 13, wherein the first, second, third, and fourth radio-frequency power amplifiers are mounted on a printed circuit board, wherein the printed circuit board has a center, and wherein the first radio-frequency power amplifier is mounted at a first distance from the center of the printed circuit board, the second radio-frequency power amplifier is mounted at a second distance from the center of the printed circuit; the third radio-frequency power amplifier is mounted at a third distance from the center of the printed circuit board, and the fourth radio-frequency power amplifier is mounted at a fourth distance from the center of the printed circuit board, wherein the second distance is greater than the first distance, wherein the third distance is greater than the second distance, and wherein the fourth distance is greater than the third distance.

19. The method defined in claim 13, wherein the first, second, third, and fourth radio-frequency power amplifiers are mounted on a printed circuit board and wherein the first radio-frequency power amplifier is mounted in a first region on the printed circuit board, the second radio-frequency power amplifier is mounted in a second region on the printed circuit board, the third radio-frequency power amplifier is mounted in a third region on the printed circuit board, and the fourth radio-frequency power amplifier is mounted in a fourth region on the printed circuit board, the method comprising:
dissipating more heat in the first region than the fourth region.

20. The method defined in claim 19, the method further comprising:
dissipating more heat in the second region than the third region.

21. The method defined in claim 20, the method further comprising:
dissipating more heat in the first region than the second region; and
dissipating more heat in the third region than the fourth region.

22. Portable electronic device circuitry, comprising:
a circuit board having a center;
a first radio-frequency power amplifier operating in an 1900 MHz band on the circuit board;
a second radio-frequency power amplifier operating in an 1800 MHz band on the circuit board;
a third radio-frequency power amplifier operating in a 900 MHz band on the circuit board; and
a fourth radio-frequency power amplifier operating in an 850 MHz band on the circuit board, wherein the first power amplifier is located at a first distance from the center, wherein the second power amplifier is located at a second distance from the center, wherein the third power amplifier is located at a third distance from the center, wherein the fourth power amplifier is located at a fourth distance from the center, wherein the second distance is greater than the first distance, wherein the third distance is greater than the second distance, and wherein the fourth distance is greater than the third distance.

23. The cellular telephone circuitry defined in claim 22, further comprising:
adjustable power supply circuitry, wherein the power supply circuitry provides first, second, third, and fourth bias voltages, wherein the first radio-frequency power amplifier is powered with the first bias voltage, wherein the second radio-frequency power amplifier is powered with the second bias voltage, wherein the third radio-frequency power amplifier is powered with the third bias voltage, wherein the fourth radio-frequency power amplifier is powered with the fourth bias voltage, wherein the second bias voltage is greater than the first bias voltage, wherein the third bias voltage is greater than the second bias voltage, and wherein the fourth bias voltage is greater than the third bias voltage.

24. The cellular telephone circuitry defined in claim 22, further comprising:
adjustable power supply circuitry, wherein the power supply circuitry provides first, second, third, and fourth bias voltages, wherein the first radio-frequency power amplifier is powered using the first bias voltage, wherein the second radio-frequency power amplifier is powered using the second bias voltage, wherein the third radio-frequency power amplifier is powered using the third bias voltage, wherein the fourth radio-frequency power amplifier is powered using the fourth bias voltage, and wherein the first, second, third, and fourth bias voltages have the same voltage value.

* * * * *